(12) United States Patent
Kang et al.

(10) Patent No.: US 7,060,564 B1
(45) Date of Patent: Jun. 13, 2006

(54) MEMORY DEVICE AND METHOD OF SIMULTANEOUS FABRICATION OF CORE AND PERIPHERY OF SAME

(75) Inventors: Inkuk Kang, Saratoga, CA (US); Hiroyuki Kinoshita, Sunnyvale, CA (US); Weidong Qian, Sunnyvale, CA (US); Kelwin King Wai Ko, San Jose, CA (US); Yu Sun, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 268 days.

(21) Appl. No.: 10/635,089

(22) Filed: Aug. 6, 2003

(51) Int. Cl.
*H01L 21/336* (2006.01)

(52) U.S. Cl. ...................... 438/266; 257/202
(58) Field of Classification Search ............... 438/261, 438/262, 266, 593, 594; 257/202, 390
See application file for complete search history.

(56) References Cited

U.S. PATENT DOCUMENTS 5,658,813 A * 8/1997 Enomoto ............... 438/258
6,159,795 A 12/2000 Higashitani et al.
6,248,629 B1 6/2001 Liu et al.
6,306,706 B1 10/2001 Chan et al.
6,436,778 B1 8/2002 Fang et al.
6,509,232 B1 1/2003 Kim et al.
6,855,608 B1 * 2/2005 Ramsbey et al. ......... 438/287

* cited by examiner

*Primary Examiner*—David Vu
(74) *Attorney, Agent, or Firm*—Renner, Otto, Boisselle & Sklar, LLP

(57) ABSTRACT

A method of fabricating a memory device having a core region of double-bit memory cells and a periphery region of logic circuitry includes forming a dielectric stack over the core and periphery areas of a semiconductor substrate and removing the dielectric stack from the periphery region. A gate dielectric is formed over the periphery area, followed by a first conductive layer over the core and periphery areas. After the formation and thermal processing of the gate dielectric, bitlines, which serve as source and drain regions, are implanted into the core area. Formation of the bitlines after the gate dielectric layer reduces lateral bitline diffusion and reduces short channel effects.

18 Claims, 5 Drawing Sheets

MEMORY DEVICE AND METHOD OF SIMULTANEOUS FABRICATION OF CORE AND PERIPHERY OF SAME

TECHNICAL FIELD

The present invention relates generally to the field of non-volatile memory devices and, more particularly, to a method of fabricating a memory device having a core region containing charge trapping dielectric flash electrically erasable and programmable memory cells and a periphery region.

BACKGROUND

A typical charge trapping dielectric flash electrically erasable and programmable memory device can be manufactured on a semiconductor substrate having a core area and a periphery area. The memory device can include a core region containing an array of double-bit memory cells and a periphery region containing logic circuitry, such as MOSFETs (metal oxide semiconductor field effect transistors). A typical array of double-bit memory cells in the core region can include, for example, 512 rows and 512 columns of double-bit memory cells. The MOSFETs in the periphery region typically are designed for use in programming and erase operations in conjunction with the double-bit memory cells. The different devices formed within the core and periphery regions can have different functional and performance requirements and, therefore, different structural features.

A pervasive trend in modern circuit manufacture is to downscale device size in order to achieve higher density circuits, while still maintaining or enhancing desirable device properties and performance. In addition, where possible, it is advantageous to form or otherwise fabricate simultaneously the core memory devices and the periphery logic devices.

However, problems may exist with the simultaneous fabrication of core and periphery devices. Processing associated with structures on one side of the device (e.g., in the periphery region) may have an adverse effect on structures on the other side of the device (e.g., in the core region). For example, in one conventional fabrication process, bitlines, which serve as source and drain regions for the memory cells, are implanted or otherwise formed in the core region, followed by formation of gate dielectric layers in the periphery region. While this fabrication methodology may provide some advantages, distinct disadvantages exist. For example, problems may exist with respect to lateral bitline diffusion in response to thermal processing associated with the formation of gate dielectric layers in the periphery region.

This lateral bitline diffusion can further reduce the channel length of the memory cells in the core region and alter the abruptness of the source/drain junctions. Due to device downscaling, memory cells are already fabricated with an active channel region having a relatively short channel length. As the physical dimensions of memory cells decrease, this process-associated reduction in channel length, taken in conjunction with processing measures already in place to reduce feature size, can lead to short channel effects (SCE) in the memory cells of the memory device. SCE can cause threshold voltage skews at the channel edges as well as excessive sub-threshold currents (e.g., punch-through and drain induced barrier lowering (DIBL)).

One solution to the problem of lateral bitline diffusion has been to reduce the thermal processing associated with the formation of the gate dielectric layer(s) in the periphery region. However, doing so results in degraded gate dielectric layers in the periphery devices, which is also highly undesirable.

Accordingly, there is a need in the art for improved methods of fabricating memory devices, such as charge trapping dielectric flash memory devices, which are both efficient and effective for producing downscaled devices.

SUMMARY OF THE INVENTION

According to one aspect of the invention, the invention is directed to a method of fabricating a memory device. The memory device can include a core region including an array of double-bit memory cells and a periphery region including associated logic circuitry. The method can include providing a semiconductor substrate having a core area and a periphery area and forming a multi-layer dielectric stack over the substrate in the core area and in the periphery area. The multi-layer dielectric stack is removed from the periphery area and at least one gate dielectric layer is formed over the substrate in the periphery area. A first conductive layer is formed over the core area and the periphery area and the first conductive layer is removed from the core area. Ion species are implanted into the core area of the semiconductor substrate. A high temperature oxidation (HTO) step is performed to (i) replace a top layer of the dielectric stack and (ii) activate implanted ion species to form buried bitlines in the core area. The HTO is removed from the periphery area and a second conductive layer is formed over the top layer of the dielectric stack in the core area and the first conductive layer in the periphery area.

BRIEF DESCRIPTION OF DRAWINGS

These and further features of the present invention will be apparent with reference to the following description and drawings, wherein.

DISCLOSURE OF INVENTION

Figure 1:
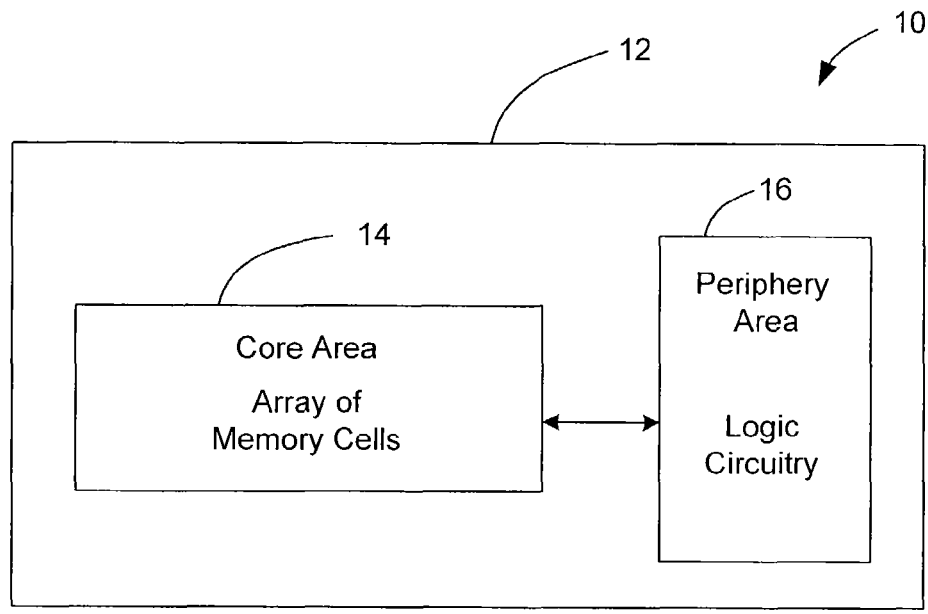
FIG. 1 is a block diagram of an exemplary memory device having a core region including an array of double-bit memory cells and a periphery region including logic circuitry.

In the detailed description that follows, corresponding components have been given the same reference numerals regardless of whether they are shown in different embodiments of the present invention. To illustrate the present invention in a clear and concise manner, the drawings may not necessarily be to scale and certain features may be shown in somewhat schematic form.

FIG. 1 schematically illustrates an exemplary charge trapping dielectric flash electrically erasable and programmable memory device 10. The memory device 10 can be manufactured on a semiconductor substrate 12 having a core area 14 and a periphery area 16. The memory device can include a core region containing an array of double-bit memory cells and a periphery region containing logic circuitry, such as MOSFETs (metal oxide semiconductor field effect transistors). A typical array of double-bit memory cells in the core region can include, for example, 512 rows and 512 columns of double-bit memory cells. The MOSFETs in the periphery region typically are designed for use in programming and erase operations in conjunction with the double-bit memory cells. The different devices formed within the core and periphery regions can have different functional and performance requirements and, therefore, different structural features.

Figure 2:
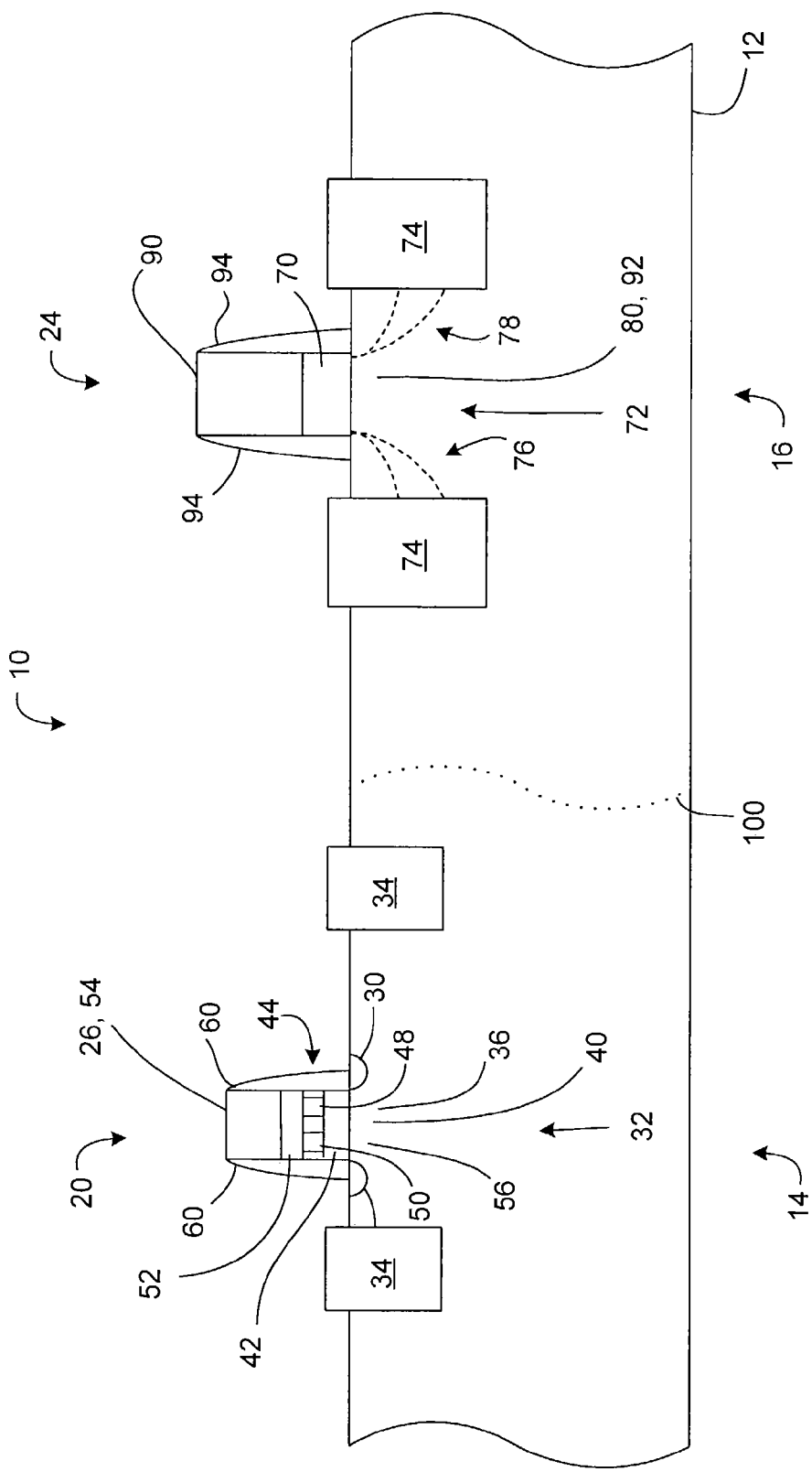
FIG. 2 is a schematic cross-section illustration of a memory device fabricated in accordance with the present invention.

With reference to FIG. 2, an exemplary charge trapping dielectric memory device 10 formed in accordance with the present invention is illustrated. The memory device 10 can include two regions or areas, a core region or area 14 containing memory cells and a periphery region or area 16 containing the rest of the chip, such as the controlling logic circuitry (e.g., NMOS and/or PMOS transistors) and the input/output devices. In one embodiment, the core region 14 can include a plurality of double-bit, charge trapping dielectric electrically erasable and programmable memory cells 20. It is to be appreciated that, while only a single double-bit memory cell 20 and a single periphery transistor 24 are shown in FIG. 2, a memory device 10 formed in accordance with the present invention includes a plurality of double-bit memory cells 20 organized in an array of rows and columns. In one embodiment, the gate electrodes 26 of each memory cell 20 in a row are coupled together to form a respective wordline for that row. In addition, the sources and drains for each memory cell 20 are coupled to or formed from bitlines 30 for each respective column of the array. Voltage potentials can be applied to corresponding components of each memory cell 20 using the logic circuitry in the periphery region 16.

In the core region 14, each charge trapping dielectric memory cell 20 can include an active region 32 of semiconductor substrate. In one embodiment, the active region 32 can initially be doped to have P-type conductivity (e.g., P dopant concentration).

Within the active region 32 of the substrate 12, a pair of buried bitlines 30 can be formed. Each buried bitline 30 can be doped to have an N-type conductivity (e.g., $N^+$ dopant concentration). Each buried bitline 30 can function as a source 36 and a drain 38, respectively, during various programming, reading, and erasing operations. As should be appreciated, the roles of the source 36 and the drain 38 can be reversed depending on the operation and the "side" of the device 20 on which the operation is conducted. Therefore, the terms "source" and "drain" can be used interchangeably.

A body 40 is formed between the source 36 and the drain 38. The body 40 can have the same dopant type and concentration as the initial doping of the active region 32 of the substrate 12. The substrate 12, the source 36, the drain 38 and the body 40 can be formed, for example, from a semiconductor such as appropriately doped silicon, germanium or silicon-germanium.

Above the body 40 is a first dielectric layer 42 (also referred to as a tunneling dielectric layer or bottom dielectric layer) that is made from, for example, silicon oxide (e.g., $SiO_2$), other standard-K material (e.g., having a relative permittivity below ten) or a high-K material (e.g., having a relative permittivity, in one embodiment, above ten and, in another embodiment, above twenty).

Over the first dielectric layer 42 is a charge trapping layer 44 (also referred to as a charge storing layer). The charge trapping layer 44 can be made from, for example, a non-conductive material, including silicon nitride (e.g., $Si_3N_4$), silicon oxide with buried polysilicon islands, implanted oxide and the like.

It is to be appreciated that, as a double-bit device, within the charge trapping layer 44, each memory cell 20 includes a first charge trapping region or cell 48 (also referred to herein as a normal cell, a first charge storing cell or normal bit) adjacent one of the buried bitlines 30 and a second charge trapping region or cell 50 (also referred to herein as a complementary cell, a second charge storing cell or complementary bit) adjacent the other buried bitline 30.

Each charge trapping cell 48, 50 can independently have two data states. The data states can represent binary values, such as a logical zero and a logical one. The logical one, for example, can be implemented by leaving the desired charge trapping cell 48, 50 in an unprogrammed state or blank programmed level. The logical zero, for example, can be implemented by storing an amount of charge in the desired charge trapping cell 48, 50. This condition is also referred to as a charged state, a programmed state, a programmed level or a charged programmed level.

Over the charge trapping layer 44 is a second dielectric layer 52 (also referred to as a top dielectric layer) made from a material such as, for example, silicon oxide (e.g., $SiO_2$), another standard-K material or a high-K material.

Over the second dielectric layer 52, a wordline 54 can be formed. In one embodiment the wordline 54 functions as a gate electrode 26, which, in part, controls a channel 56 within the body 40 interposed between the buried bitlines 30. In alternative arrangements, the wordline 54 can be formed from interconnected polysilicon gate electrode islands or pads. A work function of the gate electrode 26 controls the channel 56 (e.g., inversion or depletion) within the body 40. The wordline 54 and/or the gate electrode 26 can be made from, for example, polycrystalline silicon or another appropriate material, such as a metal or a metal containing compound. Optionally, sidewall spacers 60 can be disposed adjacent lateral sidewalls of the gate electrode 26, the second dielectric layer 52, the charge trapping layer 44 and the first dielectric layer 42 for use in controlling dopant implantation, device properties and the like.

With continued reference to FIG. 2, the logic circuitry within the periphery region 16 can include a plurality of MOSFETs 24 (metal oxide semiconductor field effect transistor). Each MOSFET 24 can include a gate dielectric 70, such as silicon oxide (e.g., $SiO_2$) formed over a periphery active region 72 of the semiconductor substrate 12 or a P-well. The periphery active region 72 of the semiconductor substrate 12 can be defined by a pair of periphery-side isolation regions 74, such as STI regions. The periphery active region 72 includes a source 76, a drain 78 and a body 80 disposed between the source 76 and the drain 78. The source 76 and the drain 78 can be formed by implanting ion species within the semiconductor substrate 12. In addition, the source 76 and the drain 78 can each be provided with an extension region or a lightly doped region and a deep doped region, as is known in the art.

A gate electrode 90 can be disposed over the gate dielectric 70 and the body 80 to define a channel 92 within the body (the channel 92 being interposed between the source 76 and the drain 78 and controlled by a work function of the gate electrode 90). In one embodiment, the gate electrode 90 can be made from a semiconductor material (e.g., polycrystalline silicon, polycrystalline silicon-germanium, etc.). Alternatively, a metal (e.g., tungsten, tantalum, aluminum, nickel, ruthenium, rhodium, palladium, platinum, titanium, molybdenum, etc.) or a metal containing compound (e.g., titanium nitride, tantalum nitride, etc.) could also be used for the gate electrode 90. Optionally, the MOFSET 24 can be provided with spacers 94 disposed adjacent each sidewall of the gate electrode 90.

With reference now to FIGS. 3–8, process steps for the fabrication of the memory device shown in FIG. 2 are illustrated in accordance with one embodiment of the present invention. For purposes of simplicity of explanation, the methodology of FIGS. 3–8 is shown and described as a series of steps. However, it is to be understood and appreciated that the present invention is not limited to the order of steps, as some steps may, in accordance with the present invention, occur in different orders and/or concurrently with other steps than that shown/described herein. Moreover, not all illustrated steps will be required to implement a methodology in accordance with an aspect of the invention. Furthermore, additional steps can be added to the fabrication techniques described herein without departing from the scope of the present invention.

Figure 3:
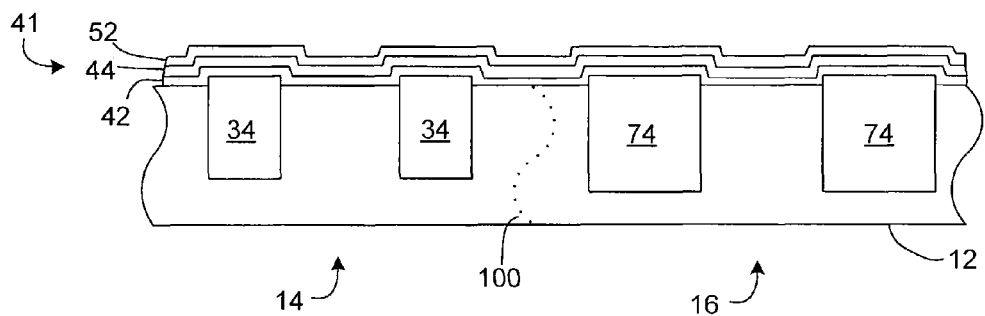
FIGS. 3–8 illustrate side cross-sectional views of fabricating steps in accordance with one embodiment of the present invention.

Referring now to FIG. 3, a method of fabricating the memory device 10 shown in FIG. 2 will be described in greater detail. As indicated, a semiconductor substrate 12 is provided. The semiconductor substrate 12 includes a core area 14 and a periphery area 16. A dashed line 100 represents the separation of the core area and the periphery area in FIGS. 3–8. A plurality of isolation regions, 34, 74 such as shallow trench isolation (STI) regions, can be formed in the semiconductor substrate 12 using one of several known techniques. For example, a first hardmask material can be patterned to form a first set of STI openings within and/or around the core area 14 and a second set of STI openings within the periphery area 16. The first hardmask material can be comprised of silicon nitride or the like. Processes for depositing and patterning the first hardmask material are known to one of ordinary skill in the art of integrated circuit fabrication.

Portions of the semiconductor substrate 12 exposed through the first and second set of STI openings are etched away such that the first and second sets of STI openings are surrounded by the semiconductor substrate 12. The first set of STI openings can surround a portion of the semiconductor substrate 12 in the core area 14 to define the core active area 32. Similarly, the second set of STI openings surround a portion of the semiconductor substrate 12 in the periphery area 16 to define a periphery active device area 72. Processes for etching away the portions of the semiconductor substrate 12 exposed through the first and second STI openings are known to one of ordinary skill in the art.

A trench dielectric material, such as silicon oxide (e.g., $SiO_2$), is deposited, grown or otherwise formed to fill the first and second set of STI openings. For example, the first and second set of STI openings may be filled using a high temperature oxidation (HTO) or a TEOS process. The uneven surface remaining after the trench dielectric formation is then planarized using any one of a number of known techniques, including, for example chemical-mechanical polishing (CMP).

Following formation of the STI regions 34, 74 in and/or around the core area 14 and the periphery area 16 of the semiconductor substrate 12, the core active area 32 can be initially doped with a dopant, such as a P-type dopant, by implanting boron ions, gallium ions or indium ions. The initial core area 14 substrate doping can provide the desired conductivity for a central portion of the body for each charge trapping dielectric memory cell formed thereon.

In addition, a high-voltage N-well and/or P-well can be formed in the periphery area 16 of the semiconductor substrate 12, as appropriate. In addition, low-voltage N-wells or P-wells can be formed in the periphery area 16, as is known in the art. In addition, $V_t$ implants may be formed by doping and/or implanting impurities into the substrate 12. As will be appreciated, the wells and $V_t$ regions may be formed later in the fabrication process using known techniques. It is to be appreciated that the formation of high-voltage and/or low-voltage wells in the periphery area 16 is effective to provide source and drain regions therein.

With continued reference to FIG. 3, a dielectric stack 41 can be formed over the semiconductor substrate 12 and the STI regions 34, 74 in both the core area 14 and the periphery area 16. It is noted that one or more layers of the dielectric stack 41 can optionally be used as an implant screen during the implantation of dopant species into the core area 14 of the substrate 12 and/or implantation of the high-voltage and/or low-voltage wells in the periphery area 16 of the substrate 12.

A layer of material used to form the first dielectric layer 42 of the dielectric stack 41 can be grown or deposited on top of the substrate 12 in both the core 14 and periphery areas 16. The first dielectric layer 42 can be formed from an appropriate dielectric material, such as a thermal oxide layer made from silicon oxide (e.g., $SiO_2$), or a high-K material. High-K materials are materials having, in one embodiment, a relative permittivity of ten (10) or higher and, in another embodiment of twenty (20) or higher. Although other high-K materials can be selected, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanite (e.g., BST) are suitable high-K materials. In addition, all binary and ternary metal oxide and ferroelectric materials having a K higher than, in one embodiment, about twenty (20) can be used for the first or bottom dielectric layer 42. The first dielectric layer 42 can have a final thickness of between about 40 angstroms and 120 angstroms depending upon the material used.

Following formation of the first dielectric material layer 42, a layer of material used to form the charge trapping layer 44 can be formed on or over the first dielectric layer. In one embodiment, the charge trapping layer can be formed from silicon nitride (e.g., $Si_3N_4$). Other suitable dielectric materials may also be used to form the charge trapping layer. The charge trapping layer 44 can have a final thickness of about 20 angstroms to about 140 angstroms.

Above or over the charge trapping material layer 44, a second or top dielectric material layer 52 can be formed. Similar to the first dielectric material layer 42, the second dielectric material layer 52 can be made from an appropriate dielectric, such as silicon oxide (e.g., $SiO_2$) or a high-K material. The second dielectric layer 52 can have a final thickness of about 60 angstroms to about 150 angstroms.

Figure 4:
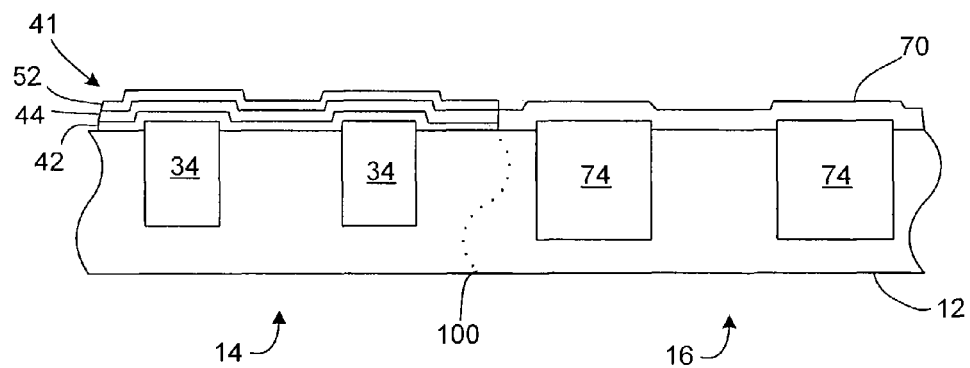

Referring now to FIG. 4, after the dielectric stack 41, including the bottom dielectric material layer 42, the charge trapping material layer 44, and the top dielectric material layer 52, has been formed over the semiconductor substrate 12 in both the core area 14 and periphery area 16, the dielectric stack 41 is etched away or otherwise removed from the periphery area 16. This can be accomplished using one of several known processes. For example, a suitable masking material can be deposited and patterned to cover the dielectric stack 41 in the core area 14, while exposing the dielectric stack 41 in the periphery area 16. The masking material can be comprised of a photoresist material according to one embodiment of the present invention. In addition, the dielectric stack 41 in the periphery area 16 can then be etched away using known techniques.

Following removal of the dielectric stack 41 from the periphery area 16, a gate dielectric layer 70 is formed over the semiconductor substrate 12 in the periphery area 16. In one embodiment, the gate dielectric layer is grown or otherwise provided using two distinct steps. For example, a first gate dielectric layer can be formed from silicon oxide (e.g., $SiO_2$) by an appropriate high temperature oxidation (HTO) or TEOS process. Growth of the first gate dielectric layer can be followed by an associated anneal cycle, such as, for example an anneal cycle of about 600 to about 1000 degrees Celsius for about 15 minutes to about 60 minutes. It is noted that following the formation of the first gate dielectric layer, a low-voltage and/or high-voltage well implant (along with associated $V_t$ implants) may be implanted through the first gate dielectric layer into the substrate 12 in the periphery area 16.

Following the formation of the first gate dielectric layer, a second gate dielectric layer can be formed, for example, from silicon oxide (e.g., $SiO_2$) over the first gate dielectric layer. The second gate dielectric layer can be formed in a manner consistent with the formation of the first gate dielectric layer, such as by an appropriate HTO or TEOS process. Growth of the second gate dielectric layer can be accompanied by, for example, an anneal cycle of about 850 degrees for about 30 to about 60 minutes. It is to be appreciated that the regrowth of additional periphery gate dielectric serves to provide a cleaner gate dielectric 70 over which to subsequently form gates and/or increase the thickness of the gate dielectrics 70 in the periphery region 16.

It is noted that, in some instances, a portion of the gate dielectric in the periphery region 16 may be removed (using, for example, lithographic techniques) leaving the periphery region 16 partially covered by the gate dielectric when the growth or regrowth of additional periphery gate dielectric material is conducted. In these instances, the remaining portion of the gate dielectric can be formed into a size-enhanced gate dielectric, while fresh gate dielectric is formed in the portions where the gate dielectric is previously removed. This can be advantageous when differently subsequently formed gates in the periphery region require gate dielectrics of different thicknesses. For instance, high-voltage gate transistors may require thicker gate oxides than low-voltage gate transistors. In these instances, the size-enhanced gate dielectric may have two or more thicknesses. The growth or regrowth of additional periphery gate dielectric material can therefore be conducted in one or more steps, two or more steps, etc.

Figure 5:
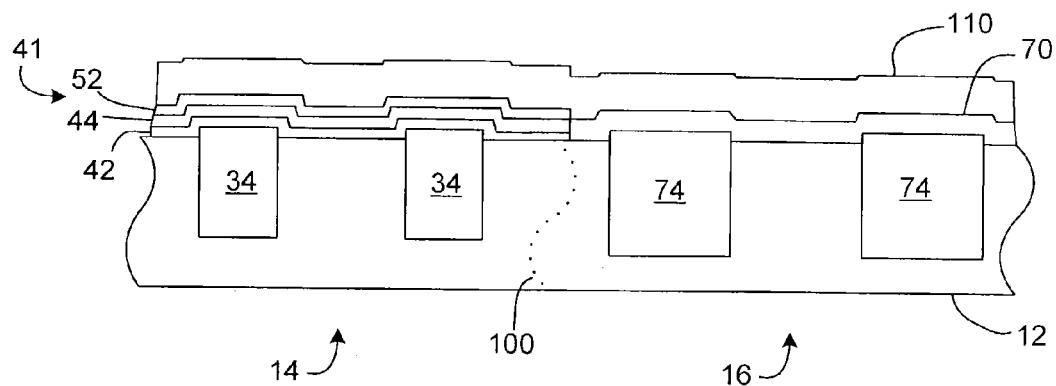

Referring now to FIG. 5, a first conductive layer 110 is formed over the top dielectric layer 52 in the core area 14 and over the gate dielectric 70 in the periphery area 16. The first conductive layer 110 can be made from polycrystalline silicon (often referred to as a "Poly 1" layer). However, it is to be appreciated that the first conductive layer 110 can be made from another appropriate material, such as a metal or metal containing compound. In one embodiment, the first polysilicon layer 110 can be deposited uniformly over each of the core and periphery areas 14, 16 using, for example, low pressure chemical vapor deposition (LPCVD). In one embodiment, the Poly 1 layer has a thickness of about 500 angstroms to about 800 angstroms.

Figure 6:
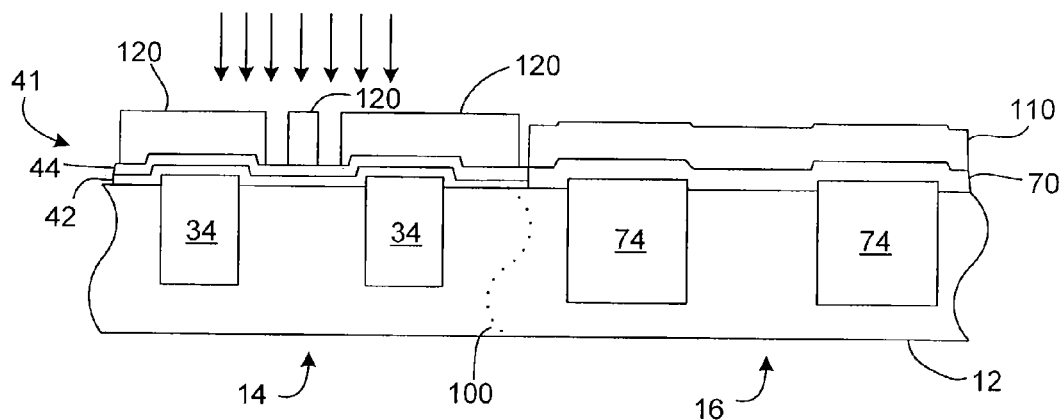

Referring now to FIG. 6, the first conductive layer 110 can then be patterned and etched, for example, using conventional polysilicon etching techniques, to completely remove the first conductive layer from the core area 14, while leaving the first conductive layer 110 intact in the periphery area 16. In addition, the top dielectric layer 52 of the dielectric stack 41 in the core area 14 can be removed via etching along with the first conductive layer 110.

Next, a bitline mask and implant step can be performed in the core area 14. In one embodiment, the masking step can include the formation of a resist layer 120 (e.g., an optical photoresist responsive to visible and near UV light, deep UV resist, and the like) over the charge trapping layer 44. The resist layer 120 can be exposed to radiation of the appropriate wavelength and developed to form an appropriate resist pattern, as shown in FIG. 6 and known to those skilled in the art. Once the masking is complete, an ion or dopant implantation process can be carried out to form a plurality of buried bitlines 30 in the core area 14. In one embodiment, the buried bitlines 30 can be formed by the dopant implantation of an N-type dopant species, as shown by the arrows in FIG. 6, (e.g., ions such as antimony, phosphorous or arsenic) through both the charge trapping layer 44 and the first or bottom dielectric layer 42. In this embodiment, it is to be appreciated that the charge trapping layer 44 and first dielectric layer 42 serve as an implant screen.

In one embodiment, the buried bitlines are formed with sufficient N-type dopant implanted to provide $N^+$ conductivity. For example, in one embodiment, arsenic ion species can be implanted with an energy of about 30 keV to about 60 keV and a dose of about $1e^{13}$ atoms/cm$^2$ to about $4e^{15}$ atoms/cm$^2$. As one skilled in the art will appreciate, the implantation energy and dose can be adjusted for the specific memory device being formed and taking into account the desired effects on programming and/or erasing of the memory device.

Figure 7:
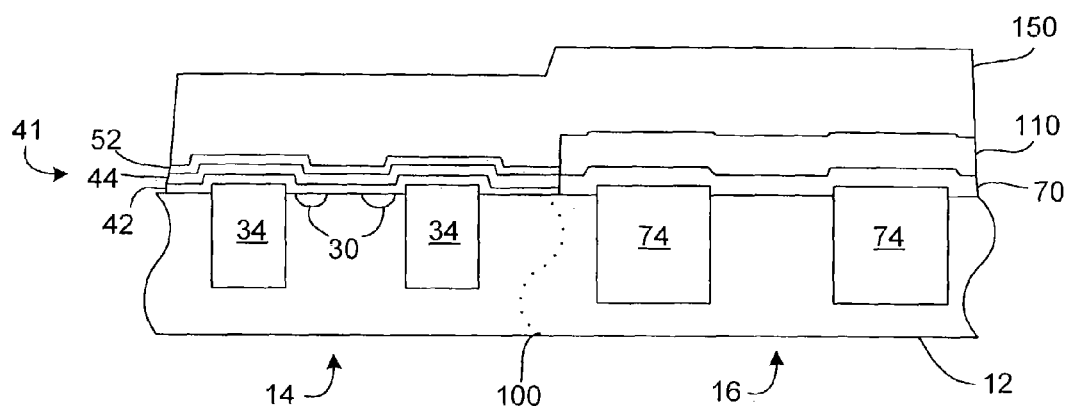

Referring now to FIG. 7, following the ion implantation, the photoresist 120 is removed from the core area 14 and the top dielectric layer 52 is reformed over both the core area 14 and the periphery area 16. As described above, the top dielectric layer 52 can be made from a silicon oxide (e.g., $SiO_2$) material deposited or otherwise formed by suitable HTO or TEOS processes. This can include an HTO densification process, which can be performed in both the core area 14 and the periphery area 16. The HTO process is effective for activating the previously implanted bitlines 30 as well as processing the newly formed top dielectric layer 52. In one embodiment, the HTO step includes annealing the device for about 30 minutes to about 40 minutes at a temperature of about 850 degrees Celsius. In addition, the HTO process can be effective to activate or otherwise diffuse the source and drain regions 76, 78 in the periphery area 16.

Figure 9:
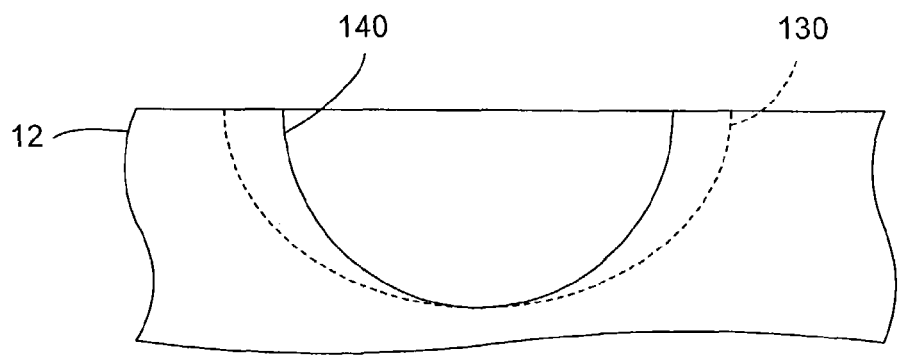
FIG. 9 illustrates a reduction in lateral diffusion for bitlines formed in accordance with the present invention.

It is to be appreciated that performing the processing steps illustrated in FIGS. 3–7 in the sequential order described above provides important advantages. For example, implanting and activating the buried bitlines 30 in the core area 14 after the formation of any necessary gate dielectric layers 70 in the periphery area 16 results in a reduction of lateral bitline diffusion in the core area 14. For example, in one embodiment, lateral bitline diffusion is reduced by approximately 50 nanometers per side of each memory cell (100 nanometers per bitline). For purposes of illustration, FIG. 9 provides a comparison of a buried bitline 130 formed in accordance with conventional fabrication techniques and a buried bitline 140 formed in accordance with one aspect of the present invention. In one embodiment, the lateral dimension of each bitline 140 is between about 150 nanometers and about 200 nanometers.

This significant reduction in lateral bitline diffusion facilitates a greater channel length between corresponding bitlines of each memory cell, thereby reducing short channel effects (SCE) that are common during memory device downscaling. In other words, the methodology described herein provides an estimated channel length gain of approximately 100 nanometers (e.g., a gain of about ten percent in channel length). In one embodiment, the channel length can be between about 1100 nanometers and about 1300 nanometers.

Further, it is to be appreciated that optimization steps may be carried out to provide a reduced thermal budget in order to reduce lateral bitline diffusion, while still providing a thermal budget high enough to form quality gate dielectric layers for the periphery transistors.

Returning now to FIG. 7, following the completion of the HTO densification process, an HTO etch and mask step is performed to etch away or otherwise remove the HTO or other top dielectric layer away from the periphery area 16. As described more fully above, such a mask and etch step can include the formation of a suitable photoresist mask followed by an etching process to remove the HTO layer from the periphery side 16.

Next, a second conductive layer 150, such as polycrystalline silicon (often referred to as a "Poly 2" layer) can be uniformly formed over the HTO or top dielectric layer 52 in the core area 14 and over the already-existing first conductive layer 110 in the periphery area 16, as shown. The second conductive layer 150 can also be made from, for example, another appropriate material, such as a metal or metal containing compound. In one embodiment, a second polysilicon layer 150 can be deposited using, for example, LPCVD techniques as are known. In one embodiment, the second conductive layer 150 can have thickness greater than the first conductive layer 110 (e.g., between about 900 angstroms and about 3000 angstroms).

As shown in FIG. 7, following the formation of the second conductive layer 150, the core area 14 of the device includes only the second conductive layer 150, which, as is explained more fully below, can form the gate electrodes 26 for each charge trapping dielectric memory cell 20 of the core area 14. In contrast, the periphery area 16 of the device includes both the first and second conductive layers 110, 150, as shown, which can be used to form the gate electrodes 90 for logic transistor 24 in the periphery area 16. In one embodiment, the method can include masking and implanting on the core area 14 in order to, for example, dope the wordlines 54 of the core memory cells 20.

Figure 8:
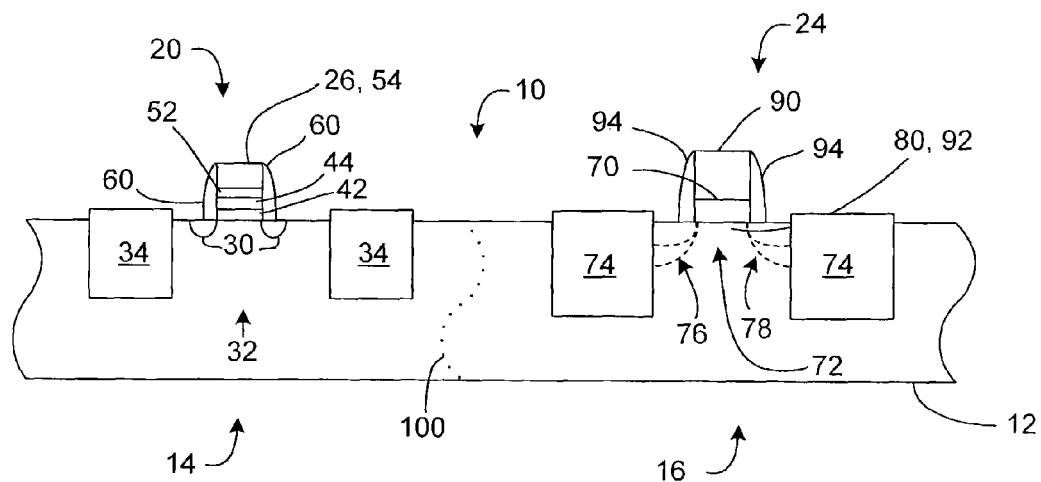

Referring now to FIGS. 2 and 8, additional processing steps to complete formation of the core side memory cells 20 and periphery side logic circuitry 24 can be carried out. For example, the layer of polysilicon 150 in the core area 14 can be etched into individual wordlines 54 using a protective mask that is patterned using a photolithographic process. In addition, the first and second conductive layers 110, 150 in the periphery area 16 can be patterned and etched using techniques that will be known to those skilled in the art. Further, interlayer dielectrics (e.g., ILD-0 and ILD-1) can optionally be formed between wordlines 54 in the core area 14. Thereafter, any additional processing steps to complete the formation of the memory device, including, but not limited to, formation of appropriate sidewall spacers and formation of bitline and/or wordline contacts, can be performed using conventional techniques.

It should be noted that in interpreting the words "above" and "over" in the specification and claims, these words are not intended to be restricted to directly above or directly over, but may include intervening layers between a layer described as being "above" or "over" another layer or substrate. For example, the description of a first material above or over a semiconductor substrate is not intended to exclude other layers being disposed therebetween.

Although, particular embodiments of the invention have been described in detail, it is understood that the invention is not limited correspondingly in scope, but includes all changes, modifications, and equivalents coming within the spirit and terms of the claims appended hereto.

What is claimed is:

1. A method of fabricating a memory device having a core region including an array of double-bit memory cells and a periphery region including associated logic circuitry, said method comprising:
   (a) providing a semiconductor substrate having a core area and a periphery area;
   (b) forming a multi-layer dielectric stack over the substrate in the core area and in the periphery area;
   (c) removing the multi-layer dielectric stack from the periphery area;
   (d) forming at least one gate dielectric layer over the substrate in the periphery area;
   (e) forming a first conductive layer over at least the periphery area;
   (f) implanting ion species into the core area of the semiconductor substrate;
   (g) performing a high temperature oxidation (HTO) step, said step being effective to (i) replace a top layer of the dielectric stack and (ii) activate implanted ion species to form buried bitlines in the core area;
   (h) removing HTO from the periphery area; and
   (i) forming a second conductive layer over the top layer of the dielectric stack in the core area and the first conductive layer in the periphery area.

2. The method according to claim 1, wherein the order of steps (d) through (f) is effective to minimize lateral diffusion of the implanted ion species.

3. The method according to claim 2, wherein the lateral diffusion of the implanted ion species forming the buried bitlines is no more than about 50 nanometers into an adjacent body region.

4. The method according to claim 1, wherein (i) replacing the top layer of the dielectric stack and (ii) activating implanted ion species to form buried bitlines in the core area are accomplished using a single thermal processing step.

5. The method according to claim 1, wherein the implanted ion species are subjected to no more than one thermal processing step.

6. The method according to claim 1, wherein the second conductive layer forms a gate electrode for the memory cells in the core area and the second and first conductive layers together form a gate electrode for the logic circuitry in the periphery area.

7. The method according to claim 6, wherein the first conductive layer has a thickness of about 500 angstroms to about 800 angstroms.

8. The method according to claim 7, wherein the second conductive layer has a thickness of about 900 angstroms to about 3,000 angstroms.

9. The method according to claim 1, wherein step (e) includes (i) forming the first conductive layer over the core area and the periphery area and (ii) removing at least the first conductive layer from the core area.

10. The method according to claim 1, wherein step (d) includes:
   (i) growing a first gate oxide layer;
   (ii) performing a first anneal cycle;
   (iii) growing a second gate oxide layer over the first gate oxide layer; and
   (iv) performing a second anneal cycle.

11. The method according to claim 10, wherein the first and second anneal cycles are each performed at a temperature of between about 600 degrees Celsius and about 1000 degrees Celsius for between about 15 minutes and about 60 minutes.

12. The method according to claim 1, wherein step (f) includes implanting ion species through a bottom dielectric layer and a charge trapping dielectric layer of the dielectric stack into the core area of the semiconductor substrate.

13. The method according to claim 1, wherein the multi-layer dielectric stack includes:
   a bottom dielectric layer;
   a charge trapping dielectric layer; and
   a top dielectric layer.

14. The method according to claim 1, further comprising:
   forming a plurality of isolation regions separating (i) the core region from the periphery region and (ii) adjacent logic circuitry devices in the periphery region.

15. The method according to claim 1, wherein step (a) includes doping the core area of the semiconductor substrate.

16. The method according to claim 1, wherein step (a) includes forming at least one of (i) high-voltage well implants and (ii) low-voltage well implants in the periphery area of the semiconductor substrate.

17. A charge trapping dielectric memory device fabricated according to the method of claim 1, wherein each double-bit memory cell in the core region includes a channel disposed between adjacent pairs of buried bitlines, said channels each having a length of about 1100 nanometers to about 1300 nanometers.

18. The charge trapping dielectric memory device according to claim 17, wherein each buried bitline has a lateral dimension of about 150 nanometers to about 200 nanometers.

* * * * *